(12) United States Patent
Boomkamp et al.

(10) Patent No.: US 8,692,583 B2
(45) Date of Patent: Apr. 8, 2014

(54) DIFFERENTIAL INTEGRATED INPUT CIRCUIT

(75) Inventors: Aloysius Johannes Maria Boomkamp, Nijmegen (NL); Stefan Butselaar, Wijchen (NL); Ben Gelissen, Nijmegen (NL); Mehdi El Ghorba, Nijmegen (NL); Cornelis Klaas Waardenburg, Zeeland (NL)

(73) Assignee: NXP B.V., Eindhoven (NL)

( * ) Notice: Subject to any disclaimer, the term of this patent is extended or adjusted under 35 U.S.C. 154(b) by 150 days.

(21) Appl. No.: 13/218,663

(22) Filed: Aug. 26, 2011

(65) Prior Publication Data

US 2013/0049845 A1  Feb. 28, 2013

(51) Int. Cl.
*H03K 5/22* (2006.01)

(52) U.S. Cl.
USPC ........... 327/67; 327/65; 330/252; 330/258

(58) Field of Classification Search
USPC ............ 327/65–67; 330/252, 253, 258
See application file for complete search history.

(56) References Cited

U.S. PATENT DOCUMENTS

| | | | | |
|---|---|---|---|---|
| 4,808,853 A * | 2/1989 | Taylor | | 326/57 |
| 5,126,586 A | 6/1992 | Gilbert | | |
| 5,168,243 A * | 12/1992 | Feliz et al. | | 330/252 |
| 6,229,394 B1 * | 5/2001 | Harvey | | 330/252 |
| 6,313,667 B1 * | 11/2001 | Eschauzier | | 327/65 |
| 6,316,969 B1 * | 11/2001 | Forbes et al. | | 327/55 |
| 6,708,665 B1 | 3/2004 | Lehmann | | |
| 7,071,780 B2 * | 7/2006 | Van Zanten | | 330/258 |
| 7,414,456 B2 * | 8/2008 | Bowers | | 327/538 |
| 2004/0207470 A1 * | 10/2004 | Van Zanten | | 330/258 |
| 2008/0042732 A1 * | 2/2008 | Bowers | | 327/538 |
| 2008/0304191 A1 * | 12/2008 | Riviere et al. | | 361/56 |
| 2009/0027125 A1 * | 1/2009 | Tansley et al. | | 330/258 |
| 2009/0033421 A1 | 2/2009 | Fitting et al. | | |
| 2009/0284288 A1 * | 11/2009 | Zhang et al. | | 327/118 |

FOREIGN PATENT DOCUMENTS

| | | | |
|---|---|---|---|
| WO | 91/18363 A1 | 11/1991 | |
| WO | 01/18363 A1 | 3/2001 | |

OTHER PUBLICATIONS

Extended European Search Report for European Patent Appln. No. 12177426.9 (Nov. 29, 2013).

* cited by examiner

*Primary Examiner* — Ryan Jager

(57) ABSTRACT

An apparatus, system, and method are provided for a differential integrated input circuit. The apparatus includes n-type semiconductor devices and p-type semiconductor devices. The p-type semiconductor devices are cross-coupled with the n-type semiconductor devices. Each of the p-type semiconductor devices biases a corresponding n-type semiconductor device.

14 Claims, 8 Drawing Sheets

DIFFERENTIAL INTEGRATED INPUT CIRCUIT

Current automobiles are controlled by what is known as an engine control unit. The engine control unit makes a variety of decisions regarding the engine based on calculated signals coming from various sensors monitoring the engine. For example, the engine control unit will determine the amount of fuel to inject based on a number of parameters including how far the throttle pedal is depressed, how much air is passing into the engine, and the temperature of the engine. The engine control unit typically includes a microprocessor that can process the inputs from the sensors. The engine control unit communicates with the sensors and other control units over, generally, a controller area network bus.

Sensors and control units must be capable of detecting bus input signals over a common range of −10 to 15V in a proper and accurate way. FIG. 1 is a schematic block diagram illustrating a circuit 100 for detecting bus input signals 102, 104. The bus input signals 102, 104 are typically fed into a voltage divider circuit 106, as is known to those of skill in the art, with the resulting Vin1 and Vin2 directed into an input stage 108. The output 110, 112 of the input stage 108 can be a current or voltage and is generally ground or supply related.

However, this circuit 100 is incapable of handling common mode voltages below ground, and therefore requires the use of a charge pump or other supply voltage. A charge pump is a DC-to-DC converter that converts a signal from one voltage level to another. The charge pump converts the below ground signals to an above ground signal that may be processed by the circuit 100. Unfortunately, the charge pump, or other supply voltage results in bulky and complicated circuits 100.

Embodiments of an apparatus are described. In one embodiment, the apparatus is a differential integrated input circuit. The apparatus includes, in one embodiment, n-type semiconductor devices and p-type semiconductor devices. The p-type semiconductor devices are cross-coupled with the n-type semiconductor devices. Each of the p-type semiconductor devices biases a corresponding n-type semiconductor device. Other embodiments of the system are also described.

Embodiments of system are also described. In one embodiment, the system is a circuit for detecting bus input signals having voltages above and below GND. The system includes a circuit coupled with a bus to detect bus input signals having voltages above and below GND by applying constant current to voltage inputs. The circuit, in one embodiment, includes n-type semiconductor devices and p-type semiconductor devices. The p-type semiconductor devices are cross-coupled with the n-type semiconductor devices. Each of the p-type semiconductor devices biases a corresponding n-type semiconductor device. Other embodiments of the apparatus are also described.

Embodiments of a method are also described. In one embodiment, the method is a method for providing a circuit. The method includes providing n-type semiconductor devices and p-type semiconductor devices. The p-type semiconductor devices cross-coupled with one of the n-type semiconductor devices. The method also includes biasing n-type semiconductor devices with corresponding p-type semiconductor devices. Other embodiments of the method are also described.

Other aspects and advantages of embodiments of the present invention will become apparent from the following detailed description, taken in conjunction with the accompanying drawings, illustrated by way of example of the principles of the invention.

Throughout the description, similar reference numbers may be used to identify similar elements.

Figure 1:
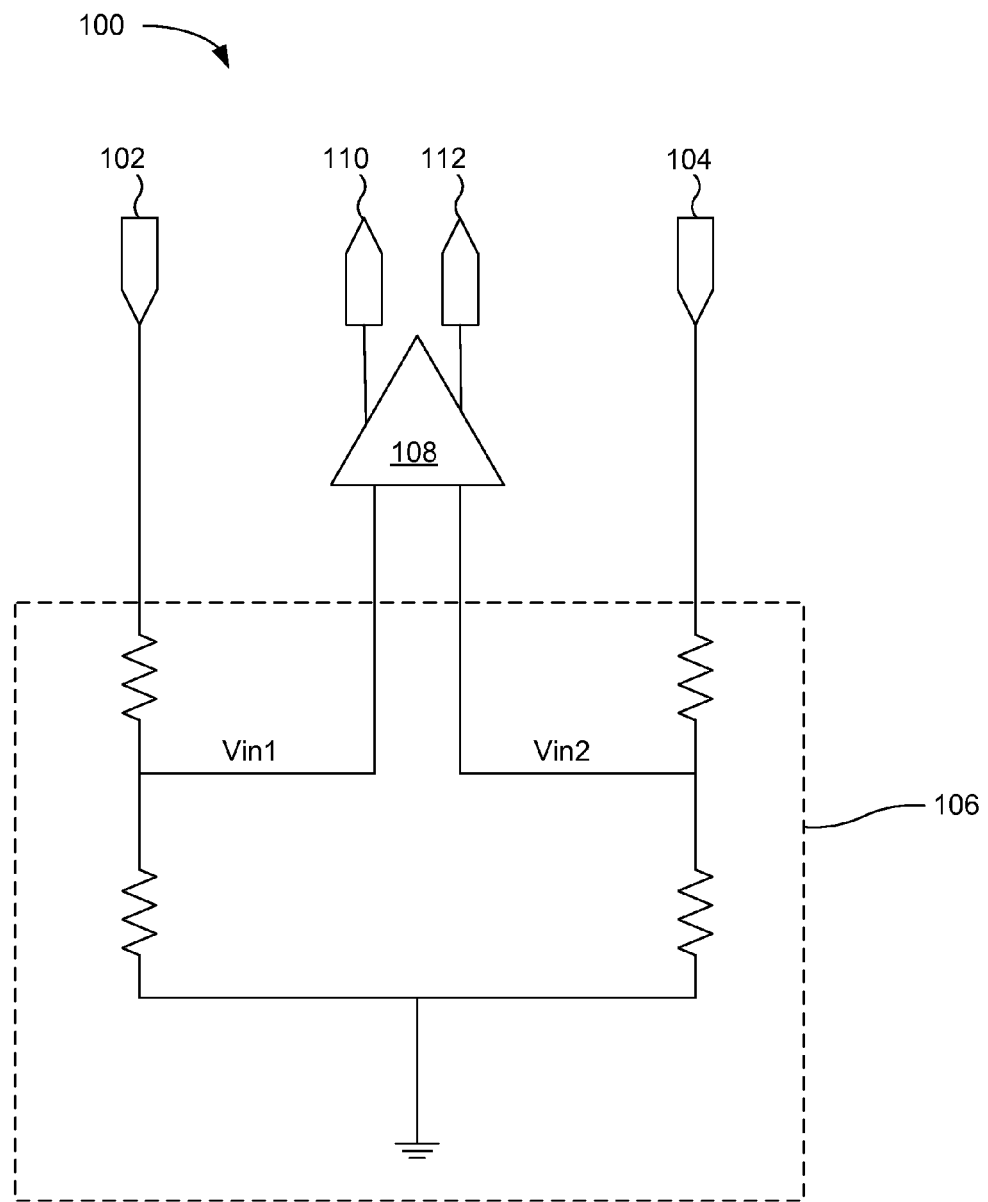
FIG. 1 is a schematic block diagram illustrating a circuit for detecting bus input signals.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments provide a differential integrated circuit topology that keeps an input current constant while handling negative and positive common mode signals with a single supply voltage. The embodiments provide a simple, accurate, and chip area saving integrated circuit. Furthermore, the embodiments described herein provide a circuit that is capable of use without a resistor divider directly coupled to bus inputs. As such, a constant input current is not required.

Some of the embodiments described herein implement an input circuit including NPN emitter couplers which are biased by cross-coupled PNP transistors. The resulting circuit provides constant input currents at resistor stacks, and therefore, a load on the resistor stacks as received from an input stage is constant even when bus voltage inputs are note equal. The features will be described in greater detail below.

Figure 2:
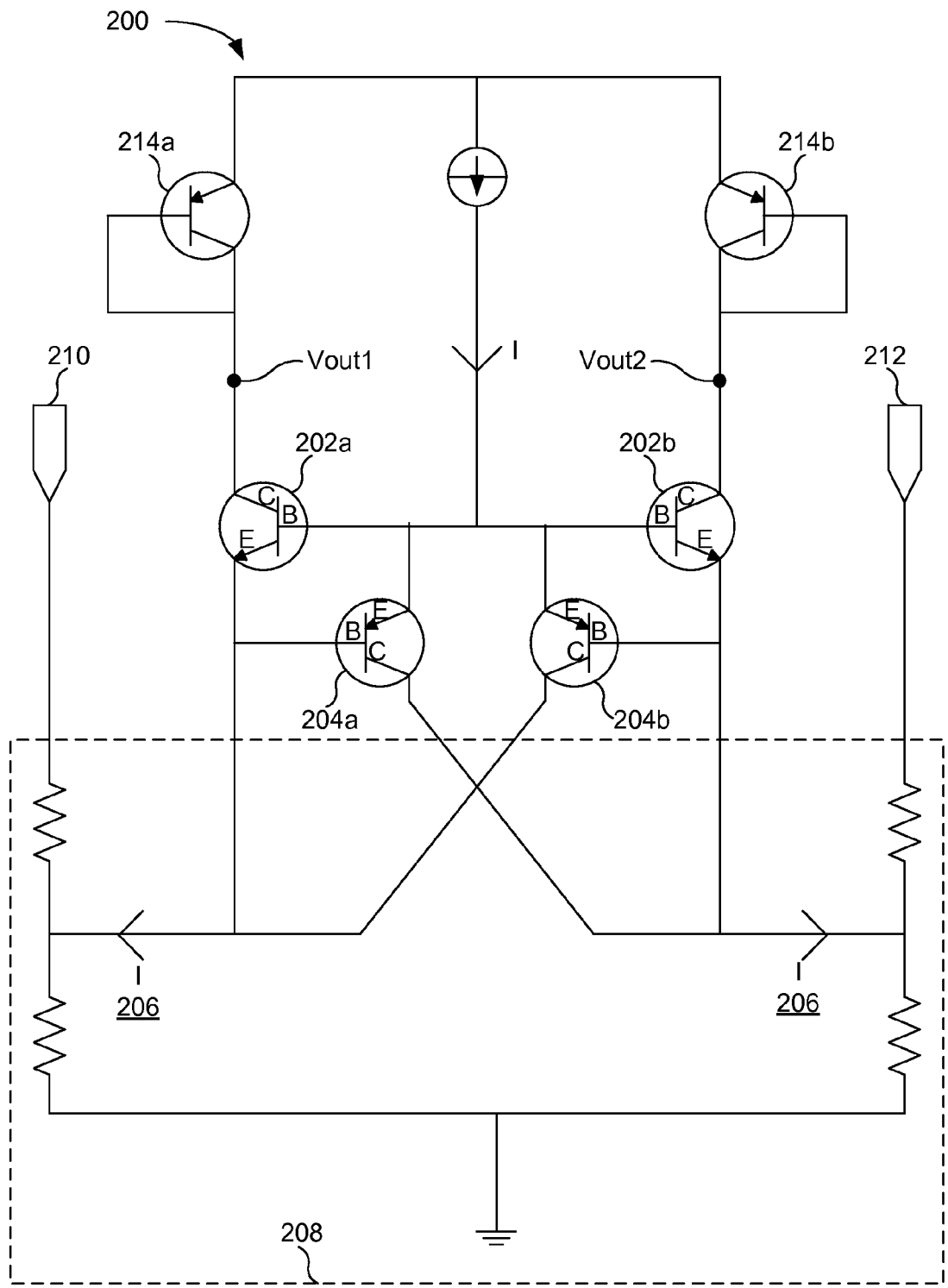
FIG. 2 is a schematic block diagram illustrating one embodiment of an input circuit.

FIG. 2 is a schematic block diagram illustrating one embodiment of an input circuit 200. The input circuit 200, as depicted, provides a high common mode rejection ratio, and high common mode range input circuit with a high differential input impedance. The circuit 200 includes at least two n-type semiconductor devices cross-coupled with two p-type semiconductor devices. In the depicted embodiment, the semiconductor devices are bipolar junction transistors formed with a base B, a collector C, and an emitter E.

The circuit 200 includes two NPN bipolar junction transistors 202a, 202b which are biased by two cross-connected PNP bipolar junction transistors 204a, 204b. For example, the emitter of the NPN transistor 202a, 202b is coupled with the base of the PNP transistor 204a, 204b, and the base of the NPN transistor 202a may be coupled with the emitter E of the PNP transistor 204a.

In a further embodiment, the base of the NPN transistor 202a, 202b is coupled with the emitter of the PNP transistor 204a, 204b. Briefly, as one of skill in the art will recognize, the NPN transistor 202a is "active" when the base is pulled high relative to the emitter, and the PNP transistor 204a is "active" when the base is pulled low relative to the emitter.

Additionally, NPN transistor 202a and PNP transistor 204a functions as a current mirror of NPN transistor 202b and PNP transistor 204b if $VBE_{npn}=VBE_{pnp}$, where VBE represents the base to emitter voltage. This results in constant input currents I 206 at the resistor stacks 208. The load on the resistor stack is constant, even when the bus inputs $V_{bus1}$ 210, $V_{bus2}$ 212 are not equal.

Referring to the depicted embodiment, it can be calculated that if there is a voltage difference ($V_{diff}$) on the bus in a way that $V_{bus1}$ 210 is positive in relation to $V_{bus2}$ 212. Assuming that base currents are neglected, the voltage difference gives a current difference in:

$$I_{202a}-I_{204a}=0.5I-\Delta I \quad \text{Eq. 1}$$

$$I_{202b}=I_{204b}=0.5I+\Delta I \quad \text{Eq. 2}$$

At the resistor stack 208 at Vbus1 210 it can be calculated that:

$$I_{202a}+I_{204b}=0.5I-\Delta I+0.5I+\Delta I=I \quad \text{Eq. 3}$$

At the resistor stack 208 at Vbus2 212 it can be calculated that:

$$I_{204a}+I_{202b}=0.5I-\Delta I+0.5I+\Delta I=I$$

Therefore, it can be demonstrated mathematically, by way of example, that the current I is constant at the resistor stacks 208. In other words, the Vbe difference at the input transistors 202a, 204a and 202b, 204b is the same as a Vbe difference over 214a and 214b related to the supply voltage.

Figure 3:
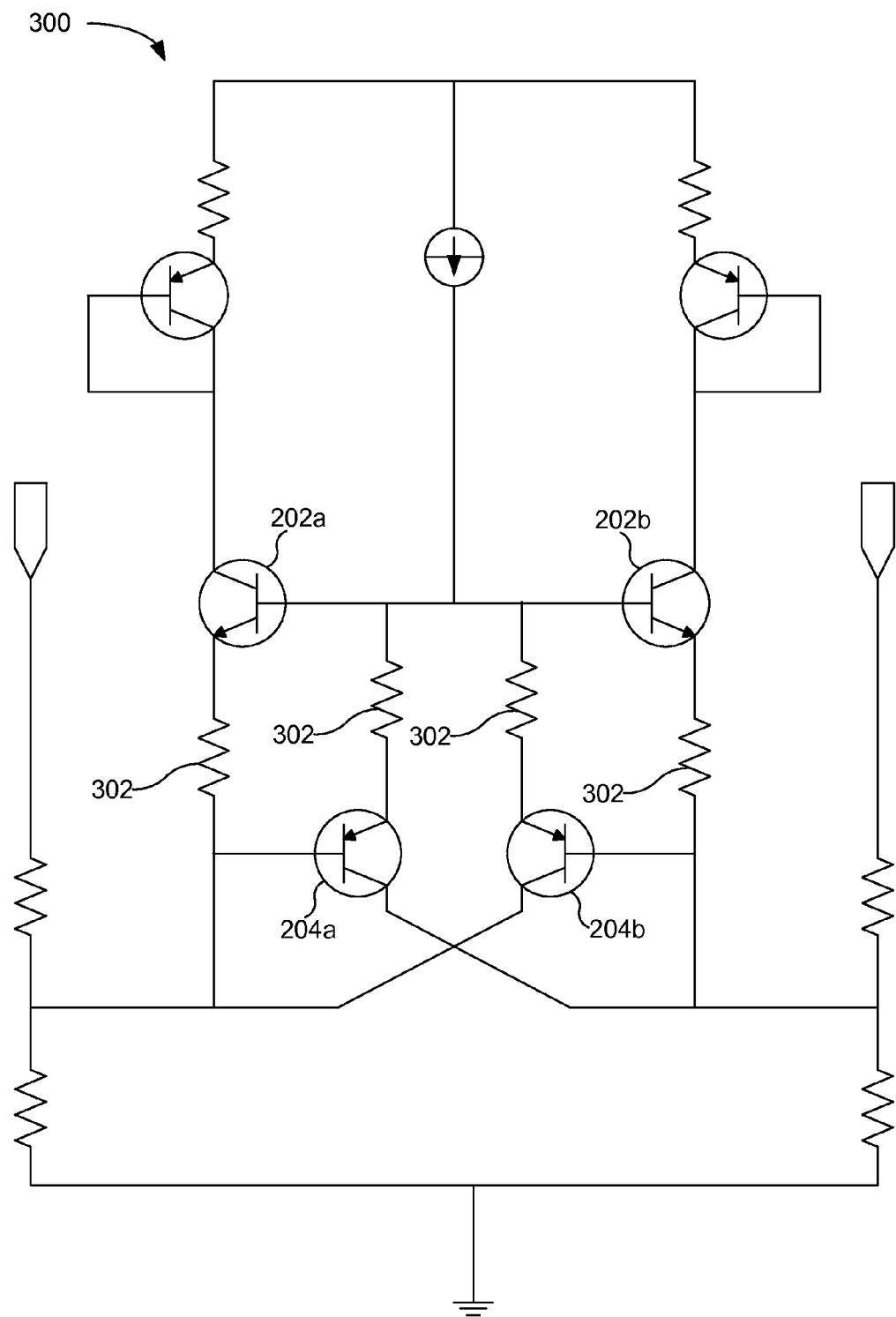
FIG. 3 is a schematic block diagram illustrating another embodiment of an input circuit.

FIG. 3 is a schematic block diagram illustrating another embodiment of an input circuit 300. In the depicted embodiment, the input circuit 300 is similar to the input circuit 200 of FIG. 2, including many similar elements. Reference to like numerals refers to like parts of FIG. 2. The circuit 300 includes at least two NPN transistors 202a, 202b which are cross-coupled with at least two PNP transistors 204a, 204b.

Furthermore, resistors 302 may be added as depicted to increase the accuracy of the circuit. Although the resisters 302 are referred to jointly, it is anticipated that the resistors may have unique resistance values selected to maximize the accuracy of the input circuit 300. Adding emitter resistance, by way of the resistors 302, decreases gain but increases linearity and stability.

The resistors 302 may be disposed between the base of one transistor and the emitter of an adjacent transistor. In one example, a resistor 302 is positioned between the emitter of the NPN transistor 202a and the base of the PNP transistor 204a.

Figure 4:
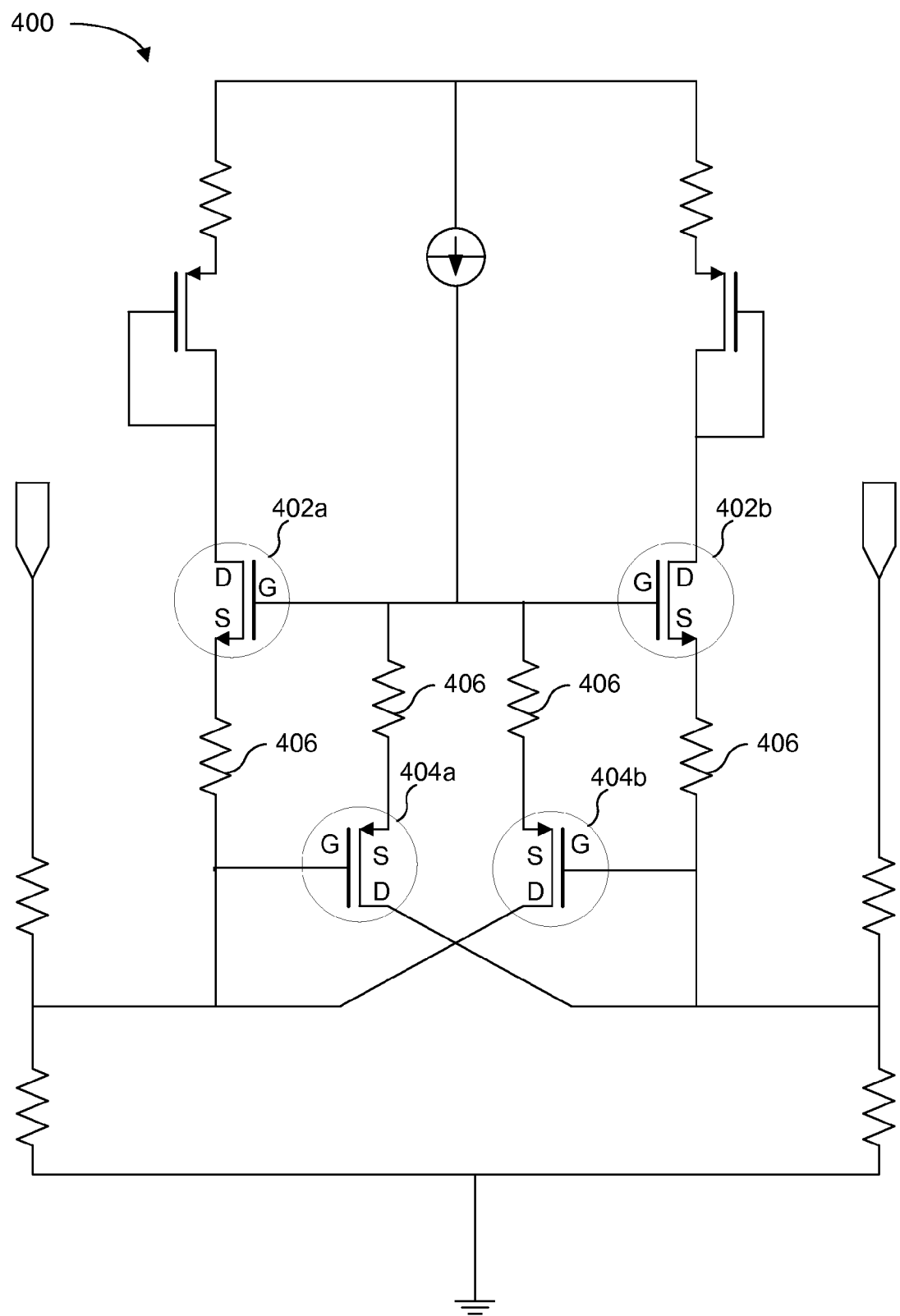
FIG. 4 is a schematic block diagram illustrating another embodiment of an input circuit.

FIG. 4 is a schematic block diagram illustrating another embodiment of an input circuit 400. The input circuit 400, in one embodiment, may be formed using an alternative semiconductor device while maintaining a constant input current on the resistor stack. In the depicted embodiment, the semiconductor device capable of use is a metal-oxide-semiconductor field-effect-transistor (MOSFET). Like the transistors of FIGS. 2 and 3, the MOSFETs may be n-type (N-channel MOSFET) or p-type (P-channel MOSFET) transistors.

Figure 5:
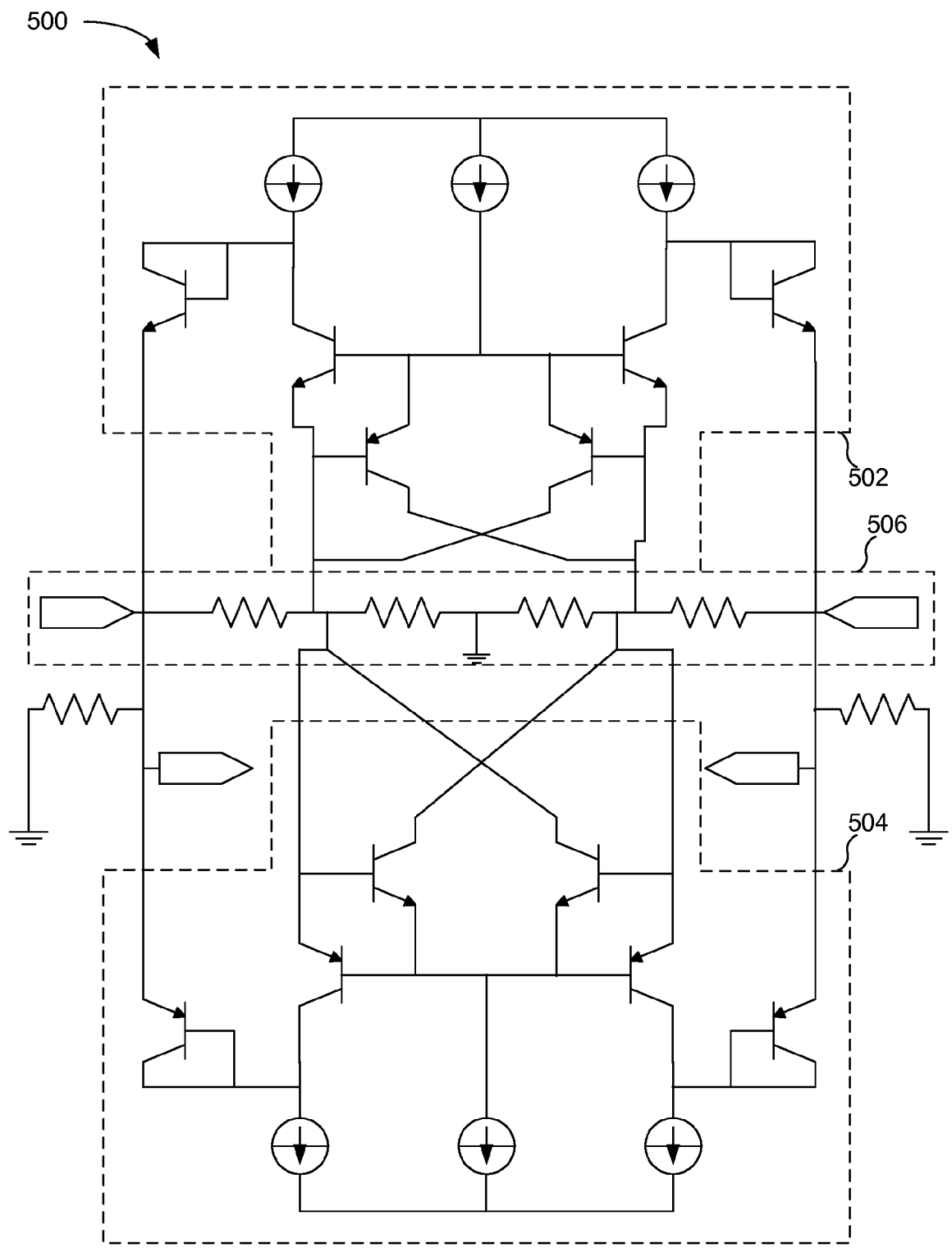
FIG. 5 is a schematic block diagram illustrating another embodiment of an input circuit.

The input circuit 400 includes at least two n-type MOSFETs 402a, 402b cross-coupled to at least two p-type MOSFETs 404a, 404b. MOSFETs are generally formed with a drain D, source S, and a gate G. As such, in this embodiment, a cross-coupled n-type MOSFET 402a is coupled from the gate G to the source S of a p-type MOSFET 404a. Likewise, the gate G of a p-type MOSFET 404a is coupled to the source S of the n-type MOSFET 402a. In a further embodiment, resistors 406 are disposed between cross-coupled MOSFETs 402a, 404a or 402b, 404b. The resistors 406 improve the accuracy of the circuit 400 by decreasing gain but increasing linearity and stability. FIG. 5 is a schematic block diagram illustrating another embodiment of an input circuit 500. In the event that the common mode voltage exceeds the limits of the supply voltage, a complementary stage may be used as illustrated.

In the depicted embodiment, the circuit 500 is formed of two sub-circuits 502, 504. A resistor stack 506, or voltage divider, may be disposed between the sub-circuits 502, 504. Sub-circuit 502 is substantially similar to circuit 200 of FIG. 2, and sub-circuit 504 is the complementary stage. In this embodiment, the differential gain may be based on the common mode voltage.

Figure 6:
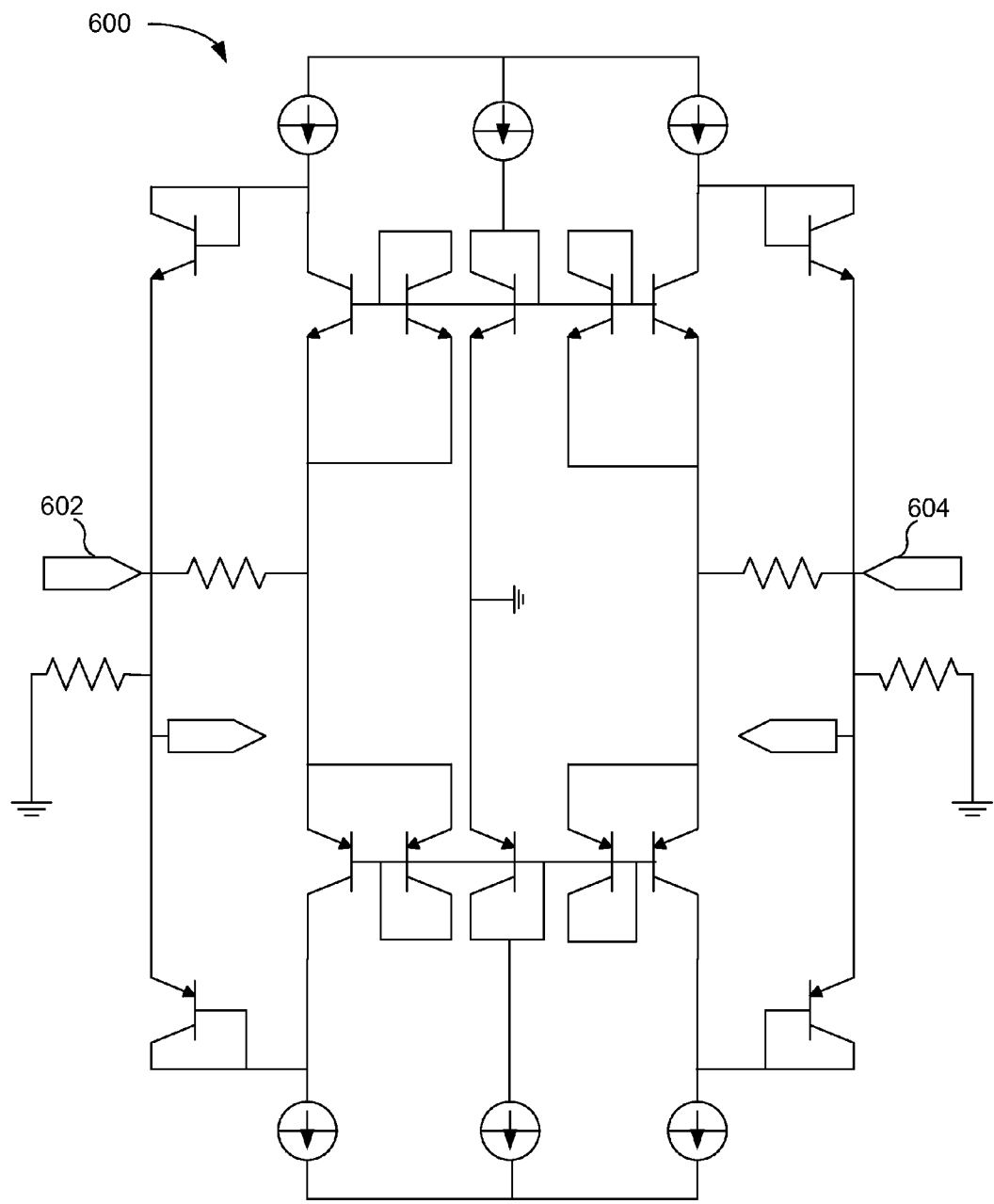
FIG. 6 is a schematic block diagram illustrating yet another embodiment of an input circuit.

FIG. 6 is a schematic block diagram illustrating yet another embodiment of an input circuit 600. In the event that a resistor stack, resistive divider, or voltage divider is not desirable, circuit 600 may be utilized as in input circuit. In the depicted embodiment, a constant current at the input sites 602, 604 is not required because when a voltage source is directly applied to the input without a resistor divider a constant current is not required.

Figure 7:
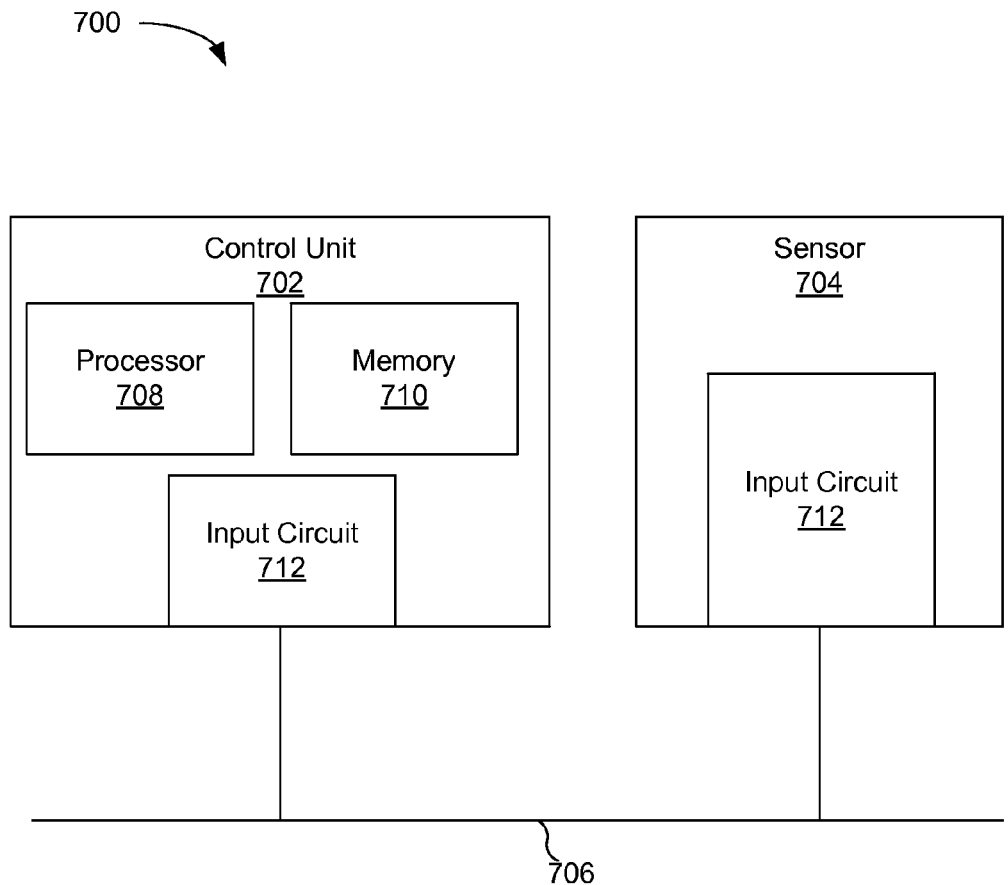
FIG. 7 is a schematic block diagram illustrating one embodiment of a system having an input circuit.

FIG. 7 is a schematic block diagram illustrating one embodiment of a system 700 having an input circuit. The system 700 is representative of a vehicle control system having a control unit 702 and a sensor 704 that communicate over a bus 706. The control unit 702, in one embodiment, is an engine control unit capable of controlling an engine in a vehicle. The control unit 702 includes a processor 708 and memory 710.

The control unit 702 is configured to monitor engine operating parameters and control the sensors 704 and control systems of the vehicle. The control unit 702 communicates with the input circuit 712 to receive messages over the vehicle bus. The input circuit 712 is configured to handle positive as well as negative input from the bus 706 with a single supply voltage by maintaining constant current on the inputs.

The input circuit 712 may be formed as described above with reference to FIGS. 2-6. For example, the circuit 712 may be formed having an n-type semiconductor device cross-coupled with a p-type semiconductor device. Examples of semiconductor devices capable of use include, but are not limited to, bipolar junction transistors, and metal-oxide-semiconductor field-effect-transistors.

Figure 8:
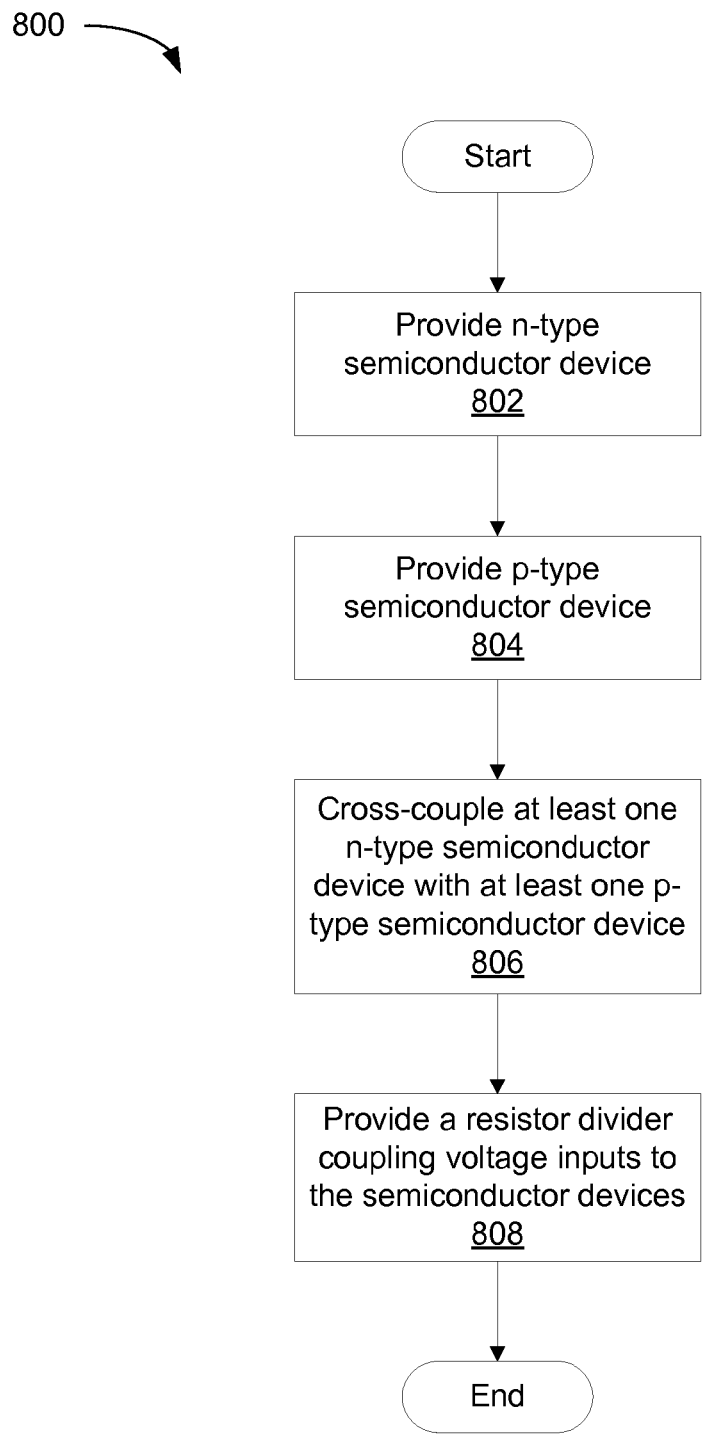
FIG. 8 is a schematic flow chart diagram illustrating one embodiment of a method of forming a circuit.

FIG. 8 is a schematic flow chart diagram illustrating one embodiment of a method 800 of forming a circuit. The method starts and at least one n-type semiconductor device is provided 802. The n-type semiconductor device may be one of a bipolar junction transistor or a metal-oxide-semiconductor field-effect-transistor. Likewise, a p-type semiconductor device is provided 804.

The method continues and at least one n-type semiconductor device is cross-coupled with at least one p-type semiconductor device. For example, the emitter of the NPN transistor is coupled with the base of the PNP transistor and the base of the NPN transistor may be coupled with the emitter E of the PNP transistor. In another example, the semiconductor devices are MOSFETs. As such, in this embodiment, a cross-coupled n-type MOSFET is coupled from the gate G to the source S of a p-type MOSFET. Likewise, the gate G of a p-type MOSFET is coupled to the source S of the n-type MOSFET. In another embodiment, a resistor divider may be couple voltage inputs with the p and n-type semiconductor devices.

In addition to the advantages which may be achieved by implementation of the individual components of the input circuit, some embodiments of the input circuit provide additional advantages over conventional technology. For example, some embodiments of the input circuit provide a simple and accurate solution for differential input. The embodiments save space on a circuit because no external power supplies are needed to handle below ground voltages.

An embodiment of an input circuit includes at least one circuit coupled directly or indirectly to memory elements of a controller through a system bus such as a data, address, and/or control bus. The memory elements can include local memory employed during actual execution of the program code, bulk storage, and cache memories which provide temporary storage of at least some program code in order to reduce the number of times code must be retrieved from bulk storage during execution.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus comprising:
a plurality of n-type semiconductor devices, wherein each of the plurality of n-type semiconductor devices comprises an emitter, a collector, and a base;
a plurality of p-type semiconductor devices, wherein each of the plurality of p-type semiconductor devices comprises an emitter, a collector, and a base; and
wherein the base of each of the plurality of p-type semiconductor devices is coupled with at least one emitter of a corresponding one of the plurality of n-type semiconductor devices, and the base of each of the plurality of n-type semiconductor devices is coupled with the emitter of at least two of the plurality of p-type semiconductor devices.

2. The apparatus of claim 1, further comprising a resistor divider coupling each of the plurality of n-type semiconductor devices and the plurality of p-type semiconductor devices with a corresponding one of the first and second voltage inputs.

3. The apparatus of claim 2, wherein the plurality of p-type semiconductor devices coupled with the plurality of n-type semiconductor devices maintain a constant current on the resistor divider despite varying input voltages.

4. The apparatus of claim 1, wherein the plurality of n-type semiconductor devices comprises n-type bipolar junction transistors, each having a base, a collector, and an emitter, and wherein the plurality of p-type semiconductor devices comprises p-type bipolar junction transistors, each having a base, a collector, and an emitter.

5. The apparatus of claim 1, wherein the plurality of n-type semiconductor devices comprises n-type metal-oxide-semiconductor field-effect-transistors, each having a gate, source, and drain, and wherein the plurality of p-type semiconductor devices comprises p-type metal-oxide-semiconductor field-effect-transistors, each having a gate, source, and drain.

6. The apparatus of claim 5, wherein cross-coupling each of the plurality of p-type metal-oxide-semiconductor field-effect-transistors with corresponding n-type metal-oxide-semiconductor field-effect-transistors comprises coupling the source of each of the plurality of p-type metal-oxide-semiconductor field-effect-transistors with the gate of corresponding n-type metal-oxide-semiconductor field-effect-transistors.

7. The apparatus of claim 5, wherein cross-coupling each of the plurality of p-type metal-oxide-semiconductor field-effect-transistors with corresponding n-type metal-oxide-semiconductor field-effect-transistors comprises coupling the source of each of the plurality of n-type metal-oxide-semiconductor field-effect-transistors with the gate of corresponding p-type metal-oxide-semiconductor field-effect-transistors.

8. A system comprising:
a circuit coupled with a bus and configured to detect bus input signals having voltages above and below GND by applying constant current to voltage inputs, wherein the circuit comprises:
a plurality of n-type transistors, wherein each of the plurality of n-type semiconductor transistors comprises an emitter, a collector, and a base;

a plurality of p-type transistors, wherein each of the plurality of p-type transistors comprises an emitter, a collector, and a base;

wherein the base of each of the plurality of p-type transistors is coupled with at least one emitter of a corresponding one of the plurality of n-type transistors, and the base of each of the plurality of n-type transistors is coupled with the emitter of at least two of the plurality of p-type transistors; and a resistor divider coupling the emitter, collector, and base of each of the plurality of n-type transistors and the plurality of p-type transistors with a corresponding one of the voltage inputs.

9. The system of claim 8, wherein the plurality of n-type transistors comprises n-type metal-oxide-semiconductor field-effect-transistors, each having a gate, source, and drain, and wherein the plurality of p-type transistors comprises p-type metal-oxide-semiconductor field-effect-transistors, each having a gate, source, and drain.

10. The system of claim 9, wherein cross-coupling each of the plurality of p-type metal-oxide-semiconductor field-effect-transistors with corresponding n-type metal-oxide-semiconductor field-effect-transistors comprises coupling the source of each of the plurality of p-type metal-oxide-semiconductor field-effect-transistors with the gate of corresponding n-type metal-oxide-semiconductor field-effect-transistors.

11. The system of claim 9, wherein cross-coupling each of the plurality of p-type metal-oxide-semiconductor field-effect-transistors with corresponding n-type metal-oxide-semiconductor field-effect-transistors comprises coupling the source of each of the plurality of n-type metal-oxide-semiconductor field-effect-transistors with the gate of corresponding p-type metal-oxide-semiconductor field-effect-transistors.

12. A method comprising:
providing a plurality of n-type semiconductor devices, wherein each of the plurality of n-type semiconductor devices comprises an emitter, a collector, and a base;
providing a plurality of p-type semiconductor devices, wherein each of the plurality of p-type semiconductor devices comprises an emitter, a collector, and a base; and
coupling the base of each of the plurality of n-type semiconductor devices with at least one emitter of a corresponding one of the plurality of p-type semiconductor devices, and coupling the base of each of the plurality of p-type semiconductor devices with the emitter of at least two of the plurality of n-type semiconductor devices.

13. The method of claim 12, further comprising providing a resistor divider and coupling each of the plurality of n-type semiconductor devices and the plurality of p-type semiconductor devices with a corresponding one of the first and second voltage inputs.

14. The method of claim 13, further comprising maintaining a constant current on the resistor divider despite varying input voltages.

* * * * *